United States Patent
Wang et al.

(10) Patent No.: US 9,491,887 B2
(45) Date of Patent: Nov. 8, 2016

(54) SERVER WITH DUAL-SIDE BRIDGE CIRCUIT BOARDS AND METHOD FOR ASSEMBLING THE SAME

(71) Applicants: Inventec (Pudong) Technology Corporation, Shanghai (CN); INVENTEC CORPORATION, Taipei (TW)

(72) Inventors: Jia-Bin Wang, Shanghai (CN); Hui Zhu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 180 days.

(21) Appl. No.: 14/583,430

(22) Filed: Dec. 26, 2014

(65) Prior Publication Data
US 2016/0143175 A1    May 19, 2016

(30) Foreign Application Priority Data
Nov. 13, 2014    (CN) .......................... 2014 1 0640280

(51) Int. Cl.
*H05K 1/14*    (2006.01)
*H05K 1/11*    (2006.01)
*H05K 7/14*    (2006.01)

(52) U.S. Cl.
CPC .......... *H05K 7/1492* (2013.01); *H05K 7/1438* (2013.01); *H05K 7/1489* (2013.01)

(58) Field of Classification Search
CPC . H05K 7/1438; H05K 7/1489; H05K 7/1492
See application file for complete search history.

(56) References Cited

U.S. PATENT DOCUMENTS

| | | | |
|---|---|---|---|
| 2016/0205804 A1* | 7/2016 | Hartman ............... | H05K 7/1492 361/679.31 |
| 2016/0205812 A1* | 7/2016 | Curtin .................. | H05K 7/1489 361/679.46 |
| 2016/0211596 A1* | 7/2016 | Kartheininger ......... | G06F 1/188 |
| 2016/0234962 A1* | 8/2016 | Shinsato .............. | H05K 7/1492 |
| 2016/0242309 A1* | 8/2016 | Heistand .............. | H05K 7/1417 |
| 2016/0242311 A1* | 8/2016 | Mao ...................... | H05K 7/1489 |

* cited by examiner

*Primary Examiner* — Yuriy Semenenko
(74) *Attorney, Agent, or Firm* — Muncy, Geissler, Olds & Lowe, P.C.

(57) ABSTRACT

A server structure includes a transfer board, a connecting backplane, a first bridge circuit board and a second bridge circuit board. The transfer board has oppositely at least one first connector and at least one second connector. The connecting backplane has at least one third connector located correspondingly to the at least one first connector and at least one fourth connector located in correspondingly to the at least one second connector. To electrically couple the transfer board and the connecting backplane, the first bridge circuit board is inserted between the first connector and the third connector, while the second bridge circuit board is inserted between the second connector and the fourth connector. The communication bandwidth between the transfer board and the connecting backplane can be extended by the combination of the first bridge circuit board and the second bridge circuit board.

9 Claims, 4 Drawing Sheets

SERVER WITH DUAL-SIDE BRIDGE CIRCUIT BOARDS AND METHOD FOR ASSEMBLING THE SAME

BACKGROUND OF INVENTION

1. Field of the Invention

The invention relates to a server and a method for assembling the server, and more particularly to the server and the corresponding assembling method that integrate a first bridge circuit board and a second bridge circuit board into the server structure.

2. Description of the Prior Art

Generally speaking, in the current field of the server technology, a transfer board is usually applied to integrate a connecting backplane and other electronic components. Typically, the connecting backplane is used to receiving a plurality of hard discs, and thus shall have a huge capacity of data transmission. Currently, the connecting backplane is usually connected directly with the transfer board. Obviously, such a connection pattern can't provide sufficient capacity to meet the transmission load from the plurality of the hard discs.

SUMMARY OF THE INVENTION

In the current art, the connecting backplane is usually coupled directly to the transfer board. However, such a connection style is hard to meet the needs in huge data transmission.

Accordingly, it is the primary object of the present invention to provide a server with dual-side bridge circuit boards and a method for assembling the same, in which a first bridge circuit board and a second bridge circuit board are electrically and integrally coupled to connect a transfer board and a connecting backplane.

In the present invention, the server with dual-side bridge circuit board includes a transfer board, a connecting backplane, a first bridge circuit board and a second bridge circuit board. The transfer board has a first top surface and a first bottom surface opposing to the first top surface. One end of the first top surface has at least one first connector, and another end of the first bottom surface has at least one second connector. The connecting backplane has a second top surface and a second bottom surface opposing to the second top surface. The second top surface has at least one third connector located correspondingly to the at least one first connector, and the second bottom surface has at least one fourth connector located in correspondingly to the at least one second connector. The first bridge circuit board is inserted between the at least one first connector and the at least one third connector so as to electrically couple the transfer board and the connecting backplane. The second bridge circuit board is inserted between the at least one second connector and the at least one fourth connector so as to electrically couple the transfer board and the connecting backplane.

In the present invention, a bandwidth for the communication between the transfer board and the connecting backplane can be extended by the combination of the first bridge circuit board and the second bridge circuit board.

In one embodiment of the present invention, the transfer board further includes a supportive frame fixed at the first bridge circuit board. The first bridge circuit board and the supportive frame are integrated as a unique a piece before this combination of the first bridge circuit board and the supportive frame is inserted to couple the at least one first connector.

Preferably, the supportive frame further includes two opposing lateral slippery grooves for sliding and guiding the first bridge circuit board in between thereof so as to be fixed inside the supportive frame. The supportive frame further includes at least one first fixation pillar fixed at the first bridge circuit board. The supportive frame further includes at least one hook protrusion for constraining the first bridge circuit board inside the supportive frame. supportive frame further includes at least one observation hole for serving an observation purpose of checking an engagement state of the first bridge circuit board and the at least one first connector of the transfer board under the supportive frame. The supportive frame further includes at least one second fixation pillar fixed at the first bottom surface.

In the present invention, the method for assembling a server with dual-side bridge circuit boards includes a step (a) of sending a first bridge circuit board into a supportive frame by sliding along two lateral slippery grooves of the supportive frame, and having at least one first fixation pillar of the supportive frame to fix the first bridge circuit board in the supportive frame, a step (b) of inserting a combination of the first bridge circuit board and the supportive frame to engage at least one first connector on a first top surface of a transfer board, a step (c) of having the supportive frame to be fixed by at least one second fixation pillar applied from a first bottom surface of the transfer board so as to fix the supportive frame and the first bridge circuit board on the transfer board, a step (d) of inserting a second bridge circuit board to engage at least one second connector on the first bottom surface, a step (e) of fixing the second bridge circuit board and the transfer board on a base casing, and a step (f) of engaging at least one third connector and at least one fourth connector of a connecting backplane respectively with the first bridge circuit board and the second bridge circuit board so as to allow the first bridge circuit board to be coupled between the at least one third connector and the at least one first connector and the second bridge circuit board to be coupled between the at least one fourth connector and the at least one second connector.

In one embodiment of the present invention, in the step (a), while the first bridge circuit board slides into the supportive frame along the two lateral slippery grooves, the first bridge circuit board is to contact and thus be constrained by at least one hook protrusion of the supportive frame.

All these objects are achieved by the server with dual-side bridge circuit boards and the method for assembling the same server described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a server with dual-side bridge circuit boards and a method for assembling the same server. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
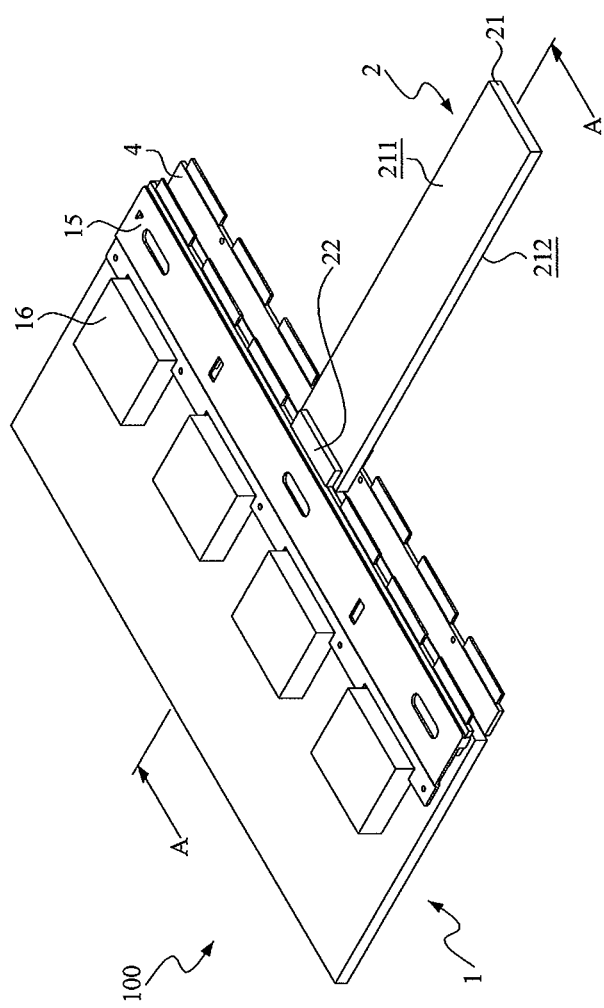
FIG. 1 is a schematic perspective view of a preferred embodiment of the server with dual-side bridge circuit boards in accordance with the present invention.
Figure 2:
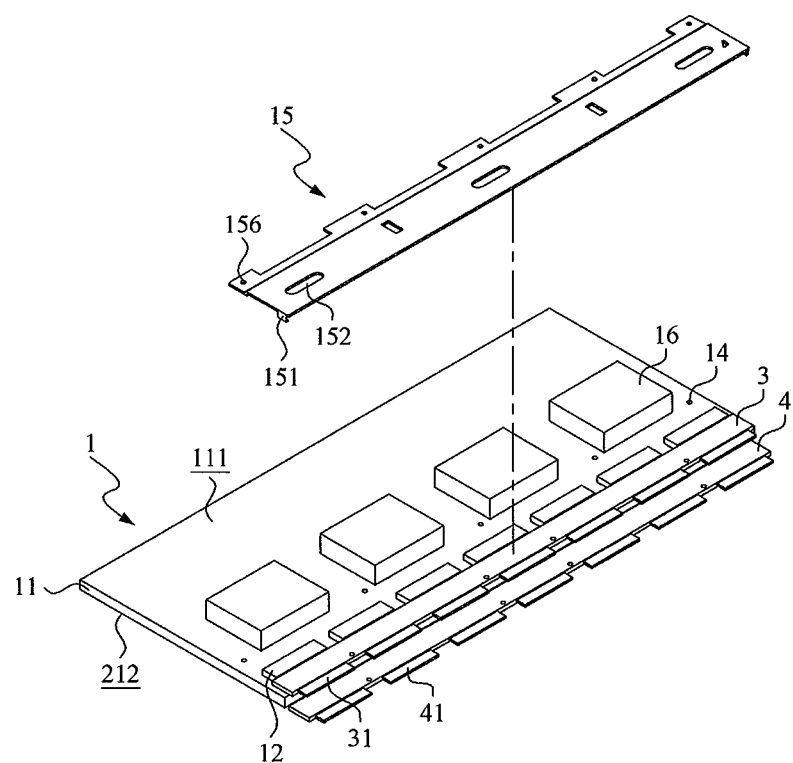
FIG. 2 is another view of FIG. 1, by exploding the supportive frame and removing the connecting backplane.
Figure 3:
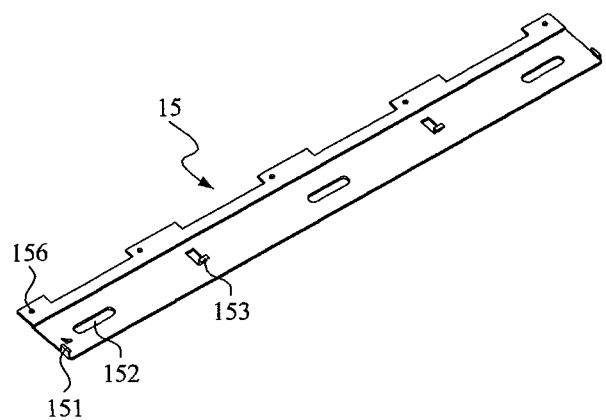
FIG. 3 is another view of the supportive frame of FIG. 2.
Figure 4:
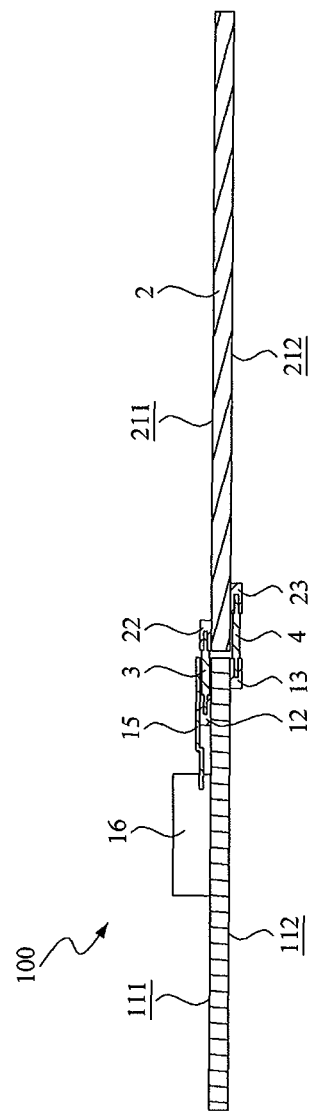
FIG. 4 is a schematic cross-sectional view of FIG. 1 along line A-A.

Refer now to FIG. 1 through FIG. 4, in which FIG. 1 is a schematic perspective view of a preferred embodiment of the server with dual-side bridge circuit boards in accordance with the present invention, FIG. 2 is another view of FIG. 1, by exploding the supportive frame and removing the connecting backplane, FIG. 3 is another view of the supportive frame of FIG. 2, and FIG. 4 is a schematic cross-sectional view of FIG. 1 along line A-A.

As shown, the server with dual-side bridge circuit boards 100 includes a transfer board 1, a connecting backplane 2, a first bridge circuit board 3 and a second bridge circuit board 4.

The transfer board 1 has a main circuit board 11, seven first connectors 12 (one labeled in the figure), seven second connectors 13 (one labeled in the figure), five fixation holes 14 (one labeled in the figure), a supportive frame 15 and four heat dissipaters 16 (one labeled in the figure). The main circuit board 11 has a first top surface 111 and a first bottom surface 112 oppositely to the first top surface 111. The seven first connectors 12 are discretely mounted on one side of the first top surface 111. The second connectors 13 are discretely mounted on one side of the first bottom surface 112. The five fixation holes 14 are evenly distributed on the transfer board 1.

The supportive frame 15 has two lateral slippery grooves 151 with base frames (one labeled in the figure), three observation holes 152 (one labeled in the figure), two hook protrusions 153 (one labeled in the figure), four first position pillars (not shown in the figure), three second position pillars (not shown in the figure) and five fixation holes 156 (one labeled in the figure).

The two lateral slippery grooves 151 are oppositely and symmetrically located to respective lateral sides of the supportive frame 15 for providing and guiding the first bridge circuit board 3 to be inserted into the supportive frame 15.

The three observation holes 152 serve the same observation purpose for the user to check the engagement state of the first bridge circuit board 3 in between with the connectors 12 of the transfer board 1 under the supportive frame 15.

The two hook protrusions 153 is to buckle up the first bridge circuit board 3 so as to position and lock the first bridge circuit board 3 inside the supportive frame 15, in which the first bridge circuit board 2 is sent through between the two lateral slippery grooves 151 of the supportive frame 15.

The first fixation pillar is fixed at the first bridge circuit board 3, and the second fixation pillar is fixed at the first bottom surface 112 by penetrating the main circuit board 11.

The five fixation holes 156 on the supportive frame 15 are located in correspondence with the other five fixation holes 14 on the main circuit board 11, and are provided for the user to fix the supportive frame 15 onto the main circuit board 11.

In this embodiment, the first bridge circuit board 3 is electrically coupled with the first connectors 12, and is firmly fixed at the transfer board 1 by the supportive frame 15.

The four heat dissipaters 16 are discretely mounted on the main circuit board 11. The supportive frame 15 is particularly constructed so as to alternatively arrange the four heat dissipaters 16 and the five fixation holes 156.

The connecting backplane 2 has a backplane body 21, a third connector 22 and a fourth connector 23. The backplane body 21 has a second top surface 211 and a second bottom surface 212 opposing to the second top surface 211. The second top surface 211 has at least one (preferably, a pair of) third connector 22 to match the corresponding first connectors 12, while the second bottom surface 212 has at least one (preferably, a pair of) fourth connector 23 to match the corresponding second connectors 13.

The first bridge circuit board 3 is inserted between the first connectors 12 and the third connectors 22, and thereby the first bridge circuit board 3 is electrically coupled to the transfer board 1 and the connecting backplane 2. As shown in the preferred embodiment, each opposing side of one end of the first bridge circuit 3 has seven connection ports 31 (one labeled in the figure) so as to engage electrically by inserting between the first connectors 12 and the third connectors 22.

The second bridge circuit board 4 is inserted between the second connectors 13 and the fourth connectors 23, and thereby is electrically coupled to the transfer board 1 and the connecting backplane 2. As shown in the preferred embodiment, each opposing side of one end of the second bridge circuit 4 has seven connection ports 41 (one labeled in the figure) so as to engage electrically by inserting between the second connectors 13 and the fourth connectors 23.

In the present invention, the first bridge circuit board 3 is applied to electrically couple the first connectors 12 and the third connectors 22, and the second bridge circuit board 4 is applied to electrically couple the second connectors 13 and the fourth connectors 23. Upon such an arrangement, communications between the transfer board 1 and the connecting backplane 2 can be performed, and the transmission bandwidth can be further extended through the integration of the first bridge circuit board 3 and the second bridge circuit board 4. In addition, the present invention further includes the supportive frame 15, so that the first bridge circuit board 3 can be firmly fixed on the transfer board 1.

Referring to FIG. 1 through FIG. 4, the method for assembling the server with dual-side bridge circuit boards 100 in accordance with the present invention includes the following steps. Firstly, the first bridge circuit board 3 is sent into a space under the supportive frame 15 by sliding along the lateral slippery grooves 151 and being stopped at the hook protrusions 153. The first fixation pillars of the supportive frame 15 are introduced to fix the first bridge circuit board 3 to the supportive frame 15. Then, the combination of the first bridge circuit board 3 and the supportive frame 15 is inserted into the first connectors 12 on the first top surface 111 of the transfer board 1. Further, the supportive frame 15 is fixed by the second fixation pillars applied from the first bottom surface 112 so as to fix the combination of the supportive frame 15 and the first bridge circuit board 3 on the transfer board 1. Next, the second bridge circuit board 4 is inserted into the second connectors 13 on the first bottom surface 112, and then the second bridge circuit board 4 and the transfer board 1 are fixed to a base casing (not shown in the figure). Finally, the third connectors 22 and the fourth connectors 23 of the connecting backplane 2 are inserted into the space between the first bridge circuit board 3 and the second bridge circuit board 4 so as to allow the first bridge circuit board 3 to be coupled between the third connectors 12 and the first connectors 22 and the second bridge circuit board 4 to be coupled between the fourth connectors 23 and the second connectors 13.

While the present invention has been particularly shown and described with reference to a preferred embodiment, it will be understood by those skilled in the art that various changes in form and detail may be without departing from the spirit and scope of the present invention.

What is claimed is:

1. A server with dual-side bridge circuit boards, comprising:
    a transfer board, having a first top surface and a first bottom surface opposing to the first top surface, one end of the first top surface having at least one first connector, another end of the first bottom surface having at least one second connector;
    a connecting backplane, having a second top surface and a second bottom surface opposing to the second top surface, the second top surface having at least one third connector located correspondingly to the at least one first connector, the second bottom surface having at least one fourth connector located in correspondingly to the at least one second connector;
    a first bridge circuit board, inserted between the at least one first connector and the at least one third connector, electrically coupled with the transfer board and the connecting backplane; and
    a second bridge circuit board, inserted between the at least one second connector and the at least one fourth connector, electrically coupled with the transfer board and the connecting backplane;
    wherein a bandwidth for a communication between the transfer board and the connecting backplane is extended by a combination of the first bridge circuit board and the second bridge circuit board.

2. The server with dual-side bridge circuit boards of claim 1, wherein the transfer board further includes a supportive frame fixed at the first bridge circuit board, the first bridge circuit board and the supportive frame being integrated as a unique a piece prior to being inserted to couple the at least one first connector.

3. The server with dual-side bridge circuit boards of claim 2, wherein the supportive frame further includes two opposing lateral slippery grooves for sliding and guiding the first bridge circuit board in between thereof so as to be fixed inside the supportive frame.

4. The server with dual-side bridge circuit boards of claim 2, wherein the supportive frame further includes at least one first fixation pillar fixed at the first bridge circuit board.

5. The server with dual-side bridge circuit boards of claim 2, wherein the supportive frame further includes at least one hook protrusion for constraining the first bridge circuit board.

6. The server with dual-side bridge circuit boards of claim 2, wherein the supportive frame further includes at least one observation hole for serving an observation purpose of checking an engagement state of the first bridge circuit board and the at least one first connector of the transfer board under the supportive frame.

7. The server with dual-side bridge circuit boards of claim 2, wherein the supportive frame further includes at least one second fixation pillar fixed at the first bottom surface.

8. A method for assembling a server with dual-side bridge circuit boards, comprising the steps of:
    (a) sending a first bridge circuit board into a supportive frame by sliding along two lateral slippery grooves of the supportive frame, and having at least one first fixation pillar of the supportive frame to fix the first bridge circuit board in the supportive frame;
    (b) inserting a combination of the first bridge circuit board and the supportive frame to engage at least one first connector on a first top surface of a transfer board;
    (c) having the supportive frame to be fixed by at least one second fixation pillar applied from a first bottom surface of the transfer board so as to fix the supportive frame and the first bridge circuit board on the transfer board;
    (d) inserting a second bridge circuit board to engage at least one second connector on the first bottom surface;
    (e) fixing the second bridge circuit board and the transfer board on a base casing; and
    (f) engaging at least one third connector and at least one fourth connector of a connecting backplane respectively with the first bridge circuit board and the second bridge circuit board so as to allow the first bridge circuit board to be coupled between the at least one third connector and the at least one first connector and the second bridge circuit board to be coupled between the at least one fourth connector and the at least one second connector.

9. The method for assembling a server with dual-side bridge circuit boards of claim 8, wherein, in the step (a), while the first bridge circuit board slides into the supportive frame along the two lateral slippery grooves, the first bridge circuit board is to contact and thus be constrained by at least one hook protrusion of the supportive frame.

* * * * *